[11] 4,147,545
[45] Apr. 3, 1979

[54] PHOTOLITHOGRAPHIC DEVELOPING COMPOSITION WITH ORGANIC LITHIUM COMPOUND

[75] Inventors: William Rowe, Westfield, N.J.; Eugene Golda, Monsey, N.Y.

[73] Assignee: Polychrome Corporation, Yonkers, N.Y.

[21] Appl. No.: 302,994

[22] Filed: Nov. 2, 1972

[51] Int. Cl.$^2$ ............................ G03C 5/34; G03F 7/08
[52] U.S. Cl. ............................................ 96/49; 96/33; 96/48 R; 96/66 R; 96/114.5; 96/48 PD; 101/456; 101/465; 101/466; 252/351; 252/352; 252/353; 252/356; 252/358
[58] Field of Search ................. 96/33, 48 R, 48 PD, 96/49, 66 R, 114.5, 75; 101/465, 466, 456; 252/351, 352, 353, 356, 358

[56] References Cited

U.S. PATENT DOCUMENTS

| | | | |
|---|---|---|---|
| 2,512,435 | 6/1950 | Mitchell et al. | 252/353 X |
| 2,657,140 | 10/1953 | Kessels | 96/75 |
| 2,660,568 | 11/1953 | Cunder et al. | 252/353 X |
| 3,091,533 | 5/1963 | Hodgins | 96/33 X |
| 3,113,026 | 12/1963 | Sprung | 96/114.5 X |
| 3,471,289 | 10/1969 | Herrick | 96/33 |
| 3,637,384 | 1/1972 | Deutsch | 96/33 X |
| 3,660,097 | 5/1972 | Mainthia | 96/33 X |
| 3,679,419 | 7/1972 | Gillich | 96/33 X |
| 3,751,257 | 8/1973 | Dahlman | 96/33 X |
| 3,762,925 | 10/1973 | Nittel | 96/114.5 X |
| 3,905,815 | 9/1975 | Bonhon | 96/33 |

FOREIGN PATENT DOCUMENTS

| | | | |
|---|---|---|---|
| 957836 | 5/1964 | United Kingdom | 96/49 |
| 957837 | 5/1964 | United Kingdom | 96/49 |

OTHER PUBLICATIONS

Windholz, M., Ed., "The Merck Index", 9th Ed., 1976, p. 5361 and p. 8330.
Grant, J., "Hackh's Chemical Dictionary", 4th Ed., 1969, pp. 392-393.

*Primary Examiner*—Charles L. Bowers, Jr.

[57] ABSTRACT

A developer composition for photosensitive coatings on substrates, particularly lithographic printing plates sensitized with substantially water-insoluble diazonium compounds, which is comprised of an aqueous solution of a substantially water-soluble organo-lithium salt, e.g., lithium naphthenate, lithium benzoate, lithium ricinoleate, etc. The novel developers quickly remove unexposed areas of the plate and yet do not detrimentally dissolve the exposed areas of the plate.

9 Claims, No Drawings

PHOTOLITHOGRAPHIC DEVELOPING COMPOSITION WITH ORGANIC LITHIUM COMPOUND

This invention relates to a developing system for photosensitive coatings on substrates, particularly diazo-sensitized photosensitive coatings on substrates, e.g., lithographic printing plates, and more particularly to compositions for developing an exposed lithographic plate to remove non-image areas and to prepare the plate for press.

Lithographic printing utilizes the immiscibility between oleophilic inks and an aqueous dampening fluid on a substantially planar printing plate surface. An oleophilic image area that corresponds to an image to be printed is formed on a plate, and the remainder of the plate surface, the non-image area, is or is made hydrophilic in character. The image area accepts greasy ink and transfers the ink during printing; the non-image area is kept damp with water or an aqueous dampening fluid and repels the ink so that no printing occurs from that area. To form such a printing plate, a flat base surface is coated with a very thin layer of a light-sensitive material and exposed to light through a transparent film having opaque areas. A negative transparency of the image desired to be reproduced is used for exposing a so-called negative-acting plate, and a positive transparency is used for exposing a so-called positive-acting plate. Light passes through the clear areas of the negative transparency, which correspond to the image, and causes a reaction in the light-sensitive coating on the underlying plate that "hardens" the coating in the image area. Light does not pass through the opaque areas of the transparency, however, so that the light-sensitive coating on the plate underlying such areas remains unaffected. The plate is then developed by removing the coating from the plate in unexposed areas, which are hydrophilic, or are then made hydrophilic. The positive-acting plate differs from the negative-acting plate in that in the former the light passing through the clear areas of the positive transparency causes the light-sensitive coating on the underlying plate to decompose to some extent, thereby resulting in a solubility differential between image and non-image areas. The exposed areas of the positive-acting plate are removed.

In the past, negative working diazo-sensitized lithographic plates have generally been developed with solvents. Some of the solvents used have been isopropyl alcohol, normal propyl alcohol, Cellosolve TM (ethylene glycol monoethyl ether), butyl alcohol, benzyl alcohol etc. Some developers consist essentially of organic solvents whereas others contain water in addition to the organic solvents. In either the organic solvent type or the aqueous type, aromatic sulfonic acids or their sodium salts have been used. These developers have suffered from one or more disadvantages when used to develop negative working diazo-sensitized lithographic plates. For example, a mixture of 20% normal propyl alcohol and 80% water, when used to develop lithographic plates, has a tendency to overdevelop the plates because of narrow solubility differential between image and non-image areas.

Sulfonic acids have been used in developers, but they have several disadvantages. They are more corrosive than the lithium salts of this invention and when used in a developing machine will tend to corrode its bearings, piping and other metallic parts. Perhaps because of this corrosive nature and its effect on image areas, plates developed with developers containing sulfonic acids do not print as many copies as those developed with the developers of this invention. Surfactant-type wetting agents are preferred in many formulations. Sulfonic acids, e.g., 2-hydroxy-4-methoxy-benzophenone-5-sulfonic acid, tend to decompose and precipitate surfactant-type wetting agents in developer compositions. Those same wetting agents result in undesirable foaming when used in developing machines. The aforementioned sulfonic acid is an ultraviolet light absorber; and as it absorbs, it discolors. Consequently, an actinic-absorbing material must be used as the material for bottles containing it.

Developers containing sodium salts of sulfonic acids and solvents such as glycols instead of surfactant-type wetting agents were found to leave a dirty background when used to machine-develop plates. To clean the background it was necessary to increase the concentration of the sodium salt of the sulfonic acid, but that resulted in a grey scale decreased by about 2 steps, i.e., the dots in the half-tone on the plate were smaller than in the transparency used in exposing it. In contrast the developers of this invention work well without added wetting agents or solvents, leave a clean background on the plate and do not reduce the grey scale.

It has been found that half-tone dots on an exposed plate are attacked and sharpened most by solvents, and then by sulfonic acids and their sodium salts in that decreasing order. Use of developers of this invention containing lithium salts results in little, if any, attack on and sharpening of half-tone dots.

The aforementioned disadvantages of the prior art are eliminated or minimized by the developers of this invention.

It is an object of this invention to provide an improved developing system for lithographic printing plates. A more particular object of this invention is to provide an improved developer composition for removing non-image areas from lithographic printing plates on which the light-sensitive agent in the coating thereon is a substantially water-insoluble diazonium compound.

The foregoing objects and others which will be apparent from the following description are achieved through use of our aqueous developing compositions containing a substantially water—soluble organo-lithium salt that readily solubilizes and removes from exposed lithographic plates the non-image areas of the light-sensitive coating in which the light-sensitive component is a diazonium compound, particularly a substantially water-insoluble diazonium compound. Generally, the developer composition is comprised of water and a substantially water-soluble organo-lithium salt as hereinafter defined. In some developer compositions of this invention, wetting agents and other components may be utilized in the composition to decrease the time required for development of the lithographic plate or to modify other characteristics of the developer compositions.

One of the important types of known negative-acting diazo components utilized in lithographic plates is comprised of reaction products of a light-sensitive diazo-containing compound and a coupling agent, which reaction products retain their light-sensitivity. The reaction products, however, generally have less water-solubility than either of their components, and generally tend to be substantially insoluble in water. Thus, while such reaction products can conveniently be coated onto bases from solvent and even from dilute aqueous solutions to make plates, their development by aqueous developers is difficult because of the relative insolubility in water or the lack of sufficient selective solubility between exposed and unexposed areas—so-called differential—in solvents.

The light-sensitive diazo-containing components of the reaction products are the negative-acting diazonium compounds known and commonly used in the lithographic art. Broadly they are diazo-aromatics, and more particularly diazo-arylamines, that can be substituted on the aromatic nucleus or on the amino-nitrogen. The most commonly used of such diazo compounds is para-diazo-diphenylamine and derivatives thereof, especially reacted with organic condensing agents containing reactive carbonyl groups, such as aldehydes and acetals, particularly with compounds such as formaldehyde and para-formaldehyde. The preparation of some such eminently suitable condensation products is disclosed in U.S. Pat. Nos. 2,922,715 and 2,946,683.

To form the light-sensitive substantially water-insoluble diazonium coating components, the diazo-aromatic compounds mentioned above preferably are reacted with aromatic or aliphatic compounds having one or more phenolic hydroxy groups or sulfonic acid groups —SO$_3$, or both. Examples of reactants having phenolic hydroxyl groups are hydroxyl benzophenones, diphenolic acids such as 4,4-bis(4'-hydroxyphenyl)-pentanoic acid, resorcinol and diresorcinol, which can be further substituted. Hydroxy-benzo-phenones include 2,4-dihydroxy-, 2-hydroxy-4-methoxy-, 2,2'-dihydroxy-4,4'-dimethoxy- and 2,2',4,4'-tetrahydroxybenzophenone. Preferred sulfonic acids are those of the aromatic series, particularly of benzene, toluene, xylene, naphthalene, phenol, naphthol and benzophenone, and the soluble salts thereof such as the ammonium and the alkali metal salts. The sulfonic acid group-containing compounds generally can be substituted by lower alkyl, nitro and halo groups as well as additional sulfonic acid groups. Examples of such compounds include benzene sulfonic acid, toluene sulfonic acid, naphthalene sulfonic acid, 2,5-dimethyl-benzene sulfonic acid, benzene sodium sulfonate, naphthalene-2-sulfonic acid, 1-naphthol-2-(or 4-)-sulfonic acid, 2,4-dinitro-1-naphthol-7-sulfonic acid, 2-hydroxy-4-methoxy-benzophenone-5-sulfonic acid, m-(p'-anilinophenylazo)-benzene sodium sulfonate, alizarin sodium sulfonate, o-toluidine-m-sulfonic acid and ethane sulfonic acid.

The diazo compound and the other reactant are reacted together, preferably in aqueous solution at a pH of below about 7.5, in approximately equimolar quantities. The reaction product is usually isolated as a precipitate, and can be coated by common techniques onto appropriate lithographic base sheets to form sensitized plates, as described; for example, in U.S. Pat. No. 3,300,309. Illustrative positive-acting systems are described in U.S. Pat. No. 3,544,317 (Yonezawa).

Illustrative of the organo-lithium salts used in the developers of this invention are the lithium salts of organic compounds having an acidic hydrogen and containing one (1) to about thirty-six (36) carbon atoms. Examples of organic compounds having acidic hydrogens are those containing carboxylic acid, sulfonic acid, sulfuric acid, and phenolic hydroxyl groups, etc. More specifically illustrative of the lithium salts are those which may be represented by the following general formulas:

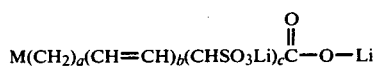  I.

  II.

III. Dimers of compounds of Formula I or II or I and II can be prepared via a procedure utilizing a Diels-Alder reaction. The lithium salts have idealized formulas such as:

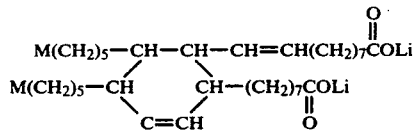

The dimerized fatty acid precursors are available from Emery Industries, Inc.

In formulas I, II and III, M=H, —OH, —COOH,

—C—O—S$_3$—Li, CH$_3$; a=an integer having a value of 0 to 17; b=an integer having a value of 0 to 3; c=an integer of from 0 to 3; the sum of b and c=an integer from 0 to 3; and the sum of a, b and c may have a maximum value of 17 when M=H or —OH, or 16 when M is any other group.

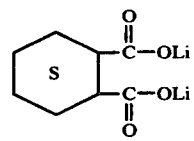  IV.

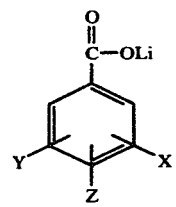  V.

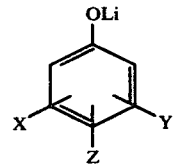  VI.

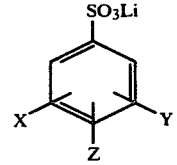  VII.

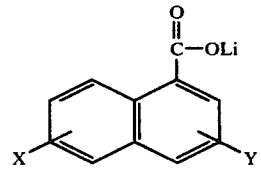  VIII.

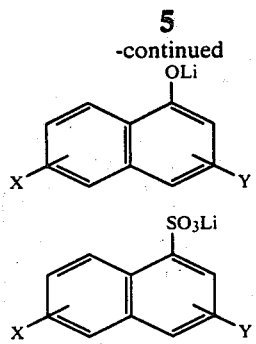

In Formulas IV to X, X or Y or Z may independently be H, —OLi, —SO₃Li or

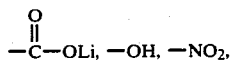

Cl, Br, —COOH, or $CH_3(CH_2)_d$ in which d may be an integer having a value of 0 to 17.

In addition to the functional groups indicated in the formulas above the lithium salts may contain in their organic moieties other functional groups which do not adversely affect their performance in the developer compositions of this invention, e.g., hydroxy, methoxy, ethoxy, nitro, halogen, etc.

Illustrative of specific water soluble lithium salts which may be used in the novel developer compositions of this invention are lithium formate, lithium chloroacetate, lithium dichloroacete, lithium trichloroacetate, lithium benzoate, lithium naphthenates, lithium dodecanoate, lithium ricinoleate, lithium lauryl sulfonate, lithium acetyl salicylate, lithium lauryl sulfate, lithium phenolate, lithium 1-phenanthrolate, lithium 0-nitrophenolate, dilithium catecholate, lithium 2,4,6-trinitrobenzoate, lithium phenol sulfonate, lithium picrate, lithium toluene sulfonate, lithium xylene sulfonate, lithium resorcinoleates, lithium xylenolates, lithium caprylates, the mono and dilithium salts of dicarboxylic acids such as citric acid, maleic acid and malic acid; lithium stearate, lithium oleate, lithium p-nitrotoluene-ortho-sulfonates, lithium toluene sulfonate, lithium 1-butane sulfonate, lithium benzene sulfonate, lithium dodecylbenzene sulfonate, lithium 2,5-dichloro-benzene sulfonate, lithium 2,4-dinitro-1-naphthol-7-sulfonate, lithium salt of sulfonated castor oil (Napco Oil 1408), and the like.

Preferably the organic compounds contain from about 2 to about 36 carbon atoms, more preferably from about 4 to about 36 carbon atoms and most preferably from about 7 to about 18 carbon atoms.

The most preferred lithium salts are lithium benzoate, lithium phenol sulfonate, lithium lauryl sulfate and lithium dodecanoate.

There appears to be no limitation on the amount of organo-lithium compounds in the developer solutions other than those dictated by practical consideration. For example, economics and the solubility of the compound in water or the aqueous developer system governs a practical upper limit of concentration, whereas time of development principally governs the lower limit. For example, at concentrations of about 1%, the development time is in the order of about five or more minutes, which from a busy lithographer's standpoint is inordinately long compared to the roughly one-half minute to about two minutes that he finds desirable. That desired range of time can be obtained with the instant developing systems at solution concentrations of from about 5% to about 25% by weight of organo-lithium compound in solution. The preferred range of concentration is about 10% to about 20%, which gives good development time, in the order of about one minute, and also provides sufficient water for dissolution and removal of the unexposed coating without the need for excessive rinsing.

It may be desirable to also include in the developer solutions additional ingredients to facilitate development and to provide plate treatment. Such ingredients are, e.g., solvents, wetting agents or surfactants, metal cleaners, etc. For example, although not necessary, up to about 10% by weight of a solvent miscible with the water is helpful to assist removal from the non-image area of the diazonium compound or especially to help dissolve organic resin either admixed with the diazonium compound in the coating on the plate or as a coating on top of the diazonium compound. The solvent is also helpful as a penetrant, especially instead of all or a part of a conventional surfactant wetting agent when the developer is to be used in a developing machine where the conventional wetting agent would have a tendency to foam undesirably. Preferably, there is used about 5% of solvents such as cyclohexanone, dimethylformamide, dimethylsulfoxide, isopropanol, dioxane and methyl Cellosolve ™. Surfactants, or wetting agents, to promote contact between the aqueous developer and the light-sensitive coating can be used in amounts up to about 5% by weight.

The wetting agents which may be used in the novel developer compositions of this invention may be nonionic, anionic or cationic. Developer compositions containing amphoteric surfactants are the subject of an application of L. Katz, W. Rowe and E. Golda filed Nov. 2, 1974, Ser. No. 303,072, now U.S. Pat. No. 3,891,438.

Illustrative of the wetting agents which may be used are:

Anionic

Such agents include ammonium and alkali metal salts of long-chain alcohol sulfates, for example, sodium lauryl sulfate, sodium octyl sulfate, ammonium lauryl sulfate, sodium N-methyl-oleyl laurate, dioctyl sodium sulfosuccinate, sodium dodecylbenzene sulfate.

Sodium di(2-ethylhexyl) phosphate [Tergitol P-28 (Union Carbide)]

Duponol series (duPont) [generally sodium alkyl sulfates]

Duponol Ep, a liquid alkyl alkylolamine sulfate (duPont)

Avirol 116 (Henkel, Inc.) [sodium lauryl ether sulfate needles]

Avirol 111 LC (Henkel, Inc.) [liquid sodium alkyl sulfate], etc.

Nonionic

Tergitol 15-S-3 (Union Carbide [a liquid polyethylene glycol ether of a linear alcohol having an HLB* of 8.0]

Tergitol NPX (Union Carbide) [a liquid nonylphenyl polyethylene glycol ether having an HLB* of 13.6]

Tergitol NP-35 (Union Carbide) [a paste nonylphenyl polyethylene glycol ether having an HLB* of 15.0]

Gaftex Texol 237 (GAF Corporation) [a diethanolamine lauric acid condensate]

Glycerol monostearate

Polyoxyethylene glycol monostearate
*Hydrophil-Lipophil Balance

Cationic

Gafstats (GAF) [quaternary ammonium derivative]
Aerosol C 61 (American Cyanamid Co.) [an ethanolated alkylquanidine amine complex] etc.

The most preferred wetting agents are the anionics, nonionics are next and then cationics. Of the anionics, the alkyl alkylolamine sulfates and sodium lauryl ether sulfates are preferred. Of the nonionics, the first three listed above are preferred.

It is preferred that the wetting agents, particularly the nonionic ones, have a hydrophil-lipophil balance (HLB) of at least about 8.

The developer compositions of this invention may also contain the aromatic or aliphatic compounds having a sulfonic acid group —$SO_3$—, which are used in the developer compositions described in U.S. Pat. No. 3,669,660 of E. Golda and A. Taudien.

Such compounds in general are the same as the ones previously described as being suitable for making, with the diazo compound, the light-sensitive reaction product that is in the sensitized coating on the plate. Examples of such compounds include benzene sulfonic acid, toluene sulfonic acid, naphthalene sulfonic acid, 2,5-dimethyl-benzene sulfonic acid, benzene sodium sulfonate, naphthalene-2-sulfonic acid, 1-naphthol-2-(or -4-)-sulfonic acid, 2,4-dinitro-1-naphthol-7-sulfonic acid, 2-hydroxy-4-methoxybenzo-phenone-5-sulfonic acid, m-(p'-anilino-phenylazo)-benzene sodium sulfonate, alizarin sodium sulfonate, o-toluidine-m-sulfonic acid and ethane sulfonic acid. The sulfonic acid group containing compounds are dissolved in water to form developer solutions.

Up to about 5% by weight of phosphoric acid or oxalic acid can also be used in the developer composition of this invention as agents to clean the aluminum base sheet after the desensitized coating is removed. Other similar agents known in the art can, in general, also be used if desired.

The pH's of the developer of this invention generally range from approximately neutral, i.e., a pH of about 5 to about 10, and some range as high as 11 or 12 or higher. This wide pH range affords a great latitude for developer formulation without adverse effect on the activity or efficiency of the developer. It is well known that at increasingly alkaline pHs there is a tendency for diazo compounds to irreversibly couple and become relatively insoluble. If an alkaline developer were to indiscriminately harden both image and non-image areas of a diazo lithographic plate it would not be considered an effective developer. It is surprising that the developers of this invention, which range in alkalinity up to a pH of approximately 11, are successful in faithfully developing lithographic plates. In view of the tendency for diazo compounds to couple under alkaline conditions, many of the prior art developers which utilized for example, sodium salts of aromatic sulfonic acids contained excess phosphoric oxalic, citric or sulfonic acid or any other acid, which was used in order to obtain a low pH.

The developers of this invention may be applied to exposed photosensitive coatings, particularly diazo-sensitized coatings, either manually or by machine. The sophisticated formulator will, of course, formulate the developer composition in accordance with the teachings of this invention to develop the particular exposed coating, whether it be on a lithographic printing plate (either presensitized or of the wipe-on kind) or on any other surface, e.g., paper or a clear plastic film as in a proofing system to proof color separation transparencies. The developer formulations of this invention are useful in developing positive-acting systems, but are particularly useful and efficient in developing negative-acting systems. For developing positive-acting systems it is preferred that the developer be on the alkaline side, preferably at a pH of at least about 12. Illustrative of positive-acting systems and lithographic plates are those described in U.S. Pat. No. 3,544,317.

It is to be understood that the following examples are given merely to illustrate the invention, and that modifications of the ingredients, proportions and conditions can be made by persons skilled in the art without departing from the scope of the invention as described hereinbefore and as defined in the appended claims.

In the following Examples all parts and percentages are by weight.

EXAMPLE 1

An aluminum plate was brush-grained, anodized and chemically treated with potassium zirconium fluoride to form a coating which functions as an interlayer in the finished plate. The treated plate was then coated by means of a whirler with a light-sensitive coating comprising: 4 parts of sensitizer (addition product of 2-hydroxy-4-methoxy-benzo-phenone-5-sulfonic acid and para-diazo diphenyl aminoformaldehyde condensate) and 1 part of a glycidyl ether polyepoxide to form a coating having a weight of 100 mg/ft.$^2$. After exposure of the plate to ultraviolet light through a negative transparency, unexposed areas were easily removed with the following developer formulations to yield a commercially acceptable lithographic plate:

(a) 5% Lithium Benzoate, 95% Water
(b) 10% Lithium Benzoate, 90% Water

EXAMPLE 2

The procedure of Example 1 was repeated, but the aluminum plate was chemically etched instead of being brush-grained. The developing results were similar.

EXAMPLE 3

The procedure of Example 1 was repeated, but the coating was composed of 1 part sensitizer and 2 parts of Formvar TM 12/85 (a polyvinyl acetal resin sold by Monsanto Company) instead of the polyepoxide. The developing results were similar.

EXAMPLE 4

Each procedure of Examples 1 to 3 was repeated to make three different plates, which were then developed with a developer containing 5% lithium benzoate, 5% alkyl alkylolamine sulfate (Duponal TM EP sold by the duPont Company) and 90% water. The developed plates were judged to be suitable for commercial use in lithography.

EXAMPLE 5

The procedures of Example 4 were repeated, but the developer formulation contained 5% of a polyethylene glycol ether of a linear alcohol (Tergitol TM 15-S-3, a product of Union Carbide Corporation) instead of Duponol EP. The developed plates were judged to be suitable for commercial use in lithography.

EXAMPLE 6

The procedures of Example 4 and 5 were repeated, but the sensitizer was the addition product of benzene sulfonic acid rather than 2-hydroxy-4-methoxy-benzophenone-5-sulfonic acid. The developed plates were judged to be suitable for commercial use in lithography.

EXAMPLE 7

The procedures of Example 5 were repeated, but 4% of an ethanolated alkylguanidine amine complex (Aerosol G61 sold by American Cyanamid Company) was used in plane of the Tergitol 15-S-3. The developing results were similar. EXAMPLE 8

The procedures of Examples 1 to 3 were repeated, but 20% Lithium Naphthenate was used instead of the amounts of lithium benzoate. The balance of the formulation was water. All the developed plates were judged to be suitable for commercial use in lithography.

EXAMPLES 9–13

The procedures of Examples 1 to 3 were repeated in each of Examples 9 to 13, but with the following lithium salts added to water to formulate developers:

| Example | Percent | Salt |
|---------|---------|------|
| 9 | 15 | Lithium Ricinoleate |
| 10 | 12 | Lithium Toluene Sulfonate |
| 11 | 15 | Lithium Xylene Sulfonate |
| 12 | 5 | Lithium Lauryl Sulfate |
| 13 | 10 | Lithium Dodecanoate |

All developed plates were judged to be suitable for commercial use in lithography.

EXAMPLE 14

The procedure of Example 10 was repeated, but the coating was composed of a mixture of 1 part of the sensitizer, 6 parts of a glycidyl ether polyepoxide and 4 parts of Formvar 12/85. The developer was composed of 12% lithium toluene sulfonate and 5% cyclohexanone in water. The developed plates were all judged to be suitable for commercial lithographic use.

EXAMPLE 15

The procedure of Example 1 is repeated but the developers also contain 5% normal propyl alcohol and 3% benzyl alcohol. The developed plate is acceptable for use in commercial lithography.

EXAMPLE 16

The procedure of Example 1 was repeated, but the aluminum plate was treated with a sodium silicate interlayer rather than potassium zirconium fluoride. The developing results were similar.

EXAMPLE 17

The procedure of Example 1 was repeated, but 10% lithium chloroacetate was used as the developer. The developing results were similar.

EXAMPLE 18

The procedure of Example 1 was repeated once with 10% lithium formate and once with 10% lithium citrate as the developer instead of those described in Example 1. The results were not quite as good as those from Example 1.

EXAMPLE 19

An Azoplate Corp. Enco ® N-2 presensitized lithographic plate was exposed to ultraviolet light through a negative transparency for two minutes. It was then developed with 15% lithium benzoate in water. The plate developed readily to yield a commercially acceptable lithographic plate.

EXAMPLE 20

The procedure of Example 19 was repeated, but an "R" presensitized lithographic plate manufactured by 3M Company was used instead of the Enco plate. The results were similar.

EXAMPLE 21

A color proofing set prepared in accordance with the teachings of U.K. Pat. No. 1,191,659 and consisting of yellow, cyan, magenta and black presensitized transparencies on a polyester base is exposed, each transparency to its corresponding color separation negative. Each exposed transparency in turn is developed with a 10% aqueous solution of lithium benzoate. When dried and then placed in proper registration, the set of exposed and developed transparencies gives a very good approximation or proof of the final four color printing.

EXAMPLE 22

A PA 200 positive-acting presensitized lithographic plate sold by Azoplate Corporation was exposed to ultra-violet light through a positive photographic transparency. The exposed plate was developed with a 12% solution of lithium benzoate having its pH adjusted to 12 by addition of 3% NaOH.

EXAMPLE 23

Table I which follows gives comparative data on press performance of plates developed with different developer compositions. The first two columns in the table give the developer compositions and the compositions of the plate coating in parts by weight. The sensitizer is the same as the sensitizer in Example 1 above. The coating weight is given in milligrams per square foot. The substrates for the first two plates described were prepared in accordance with the procedure of Example 1 above. The third and fourth plates in the Table had substrates prepared in accordance with the procedure of Example 2 above. The method of development was by hand application of the developer with an applicator pad. The image areas and non-image areas are described. The grey scale used is a continuous tone 21-step guide which is available from Stouffer Graphic Arts Equipment Company (South Bend, Ind.). The press run was conducted by locking-up the plate on a Chief 22 lithographic press which was 0.006" "overpacked", by which is meant that the plate was shimmed-up to 0.006" higher than normal, thereby causing the plate to contact the rollers with a pressure greater than would normally be used. Over-packing causes excessive wear of the plate compared to what would occur on a properly adjusted press. The fountain solution contained 35% isopropanol. Usually fountain solutions contain no more than 25% alcohol. The more alcohol in the fountain solution, the greater the adverse effect on the image area of the plate that can be expected. The ink used was Chromatone #4559 (a product of Chromatone Printing Ink Company, a subsidiary of Polychrome Corporation). The paper used was 70 lb. white offset paper which was reused a maximum of three times. 5,000 copies were printed and the quality of the printing was as indicated in the column of the Table entitled "Press Run".

Bulletin No. 215, issued by The Lithographic Technical Foundation, Inc. The press run was conducted by locking-up the plate on a Chief 22 lithographic press which was 0.006 inches "over-packed", by which is meant that

TABLE I

Comparison Data on Plate Development by Different Developers
2 Minute Exposure in Nu Arc (Carbon Arc) Exposure Frame

| DEVELOPER | COMPOSITION OF PLATE COATING (Parts by Weight) | COATING WEIGHT (mg/sq. ft.) | SUBSTRATE | METHOD OF DEVELOPMENT | IMAGE AREAS | NON-IMAGE AREAS | PRESS RUN |
|---|---|---|---|---|---|---|---|
| 10% Lithium Benzoate 90% Water | 7 Sensitizer 1 glycidyl ether polyepoxide | 55 | Brush-Grained, Anodized Aluminum; Potassium Zirconium Fluoride Interlayer | By hand using standard applicator | Gray Scale-- Solid 5, Tail 8; Halftones reproduction similar to negative transparency | No coating remaining on plate in unexposed areas | 5000 copies on over-packed press-acceptable reproduction |
| 10% Benzene Sulfonic Acid 90% Water | 7 Sensitizer 1 Glycidyl ether polyepoxide | " | " | " | Gray Scale-- Solid 9, Tail 8; halftone reproduction shows plugging (remaining unexposed polymer left on plate surface) | Coating remaining on plate in unexposed areas | 5000 copies on over-packed press-non-image areas showed scumming |
| 15% Lithium Phenol Sulfonate 5% NP-35 80% Water | 4 Sensitizer 1 glycidyl ether polyepoxide | 110 etched, | Brush-Grained, Chemically Anodized Aluminum; Sodium silicate interlayer | Hand development | Gray Scale-- Solid 6, Tail 8; Image reproduction similar to negative transparency | No coating remaining on plate in unexposed areas | 5000 copies on over-packed press-acceptable reproduction |
| 15% 2-Hydroxy 4-methoxy 5 Sulfonic Acid Benzophenone 5% Tergitol NP-35 10% Water | 4 Sensitizer 1 glycidyl ether polyepoxide | 110 | Brush-grained, Chemically etched, Anodized Aluminum; Sodium silicate interlayer | hand development | Gray Scale-- Solid 8, Tail 14; Halations in tint areas due to inadequate development | Coating remaining on plate in unposed areas | 5000 copies on over-packed press-non-image areas showed scumming on copy |

EXAMPLE 24

Table II which follows gives comparative data on press performance of plates developed with different developer compositions. The first column in the Table gives the developer compositions. The plate coatings were comprised of the ingredients listed in the second column. The sensitizer is the same as the sensitizer in Example 1 above. The coating weight is given in milligrams per square foot. The method of development was by hand application of the developer with an applicator pad or by machine as indicated. The image areas and non-image areas are described. The grey scale used is a continuous tone 21-step guide which is available from Stouffer Graphic Arts Equipment Company (South Bend, Ind.). A general discussion of the utility of grey scales is given in "The Sensitivity Guide", Research the plate was shimmed-up to 0.006 inches higher than normal, thereby causing the plate to contact the rollers with a pressure greater than would normally be used. Overpacking causes excessive wear of the plate compared to what would occur on a properly adjusted press. The fountain solution contained 35% isopropanol. Usually fountain solutions contain no more than 25% alcohol. The more alcohol in the fountain solution, the greater the adverse effect on the image area of the plate that can be expected. The ink used was Chromatone #4559 (a product of Chromatone Printing Ink Company, a subsidiary of Polychrome Corporation). The paper used was 70 lb. white offset paper. 5,000 copies were printed and the quality of the printing of the copies at the end of the run was as indicated in the column of the Table entitled "Press Run".

TABLE II

Comparison Data on Plate Development by Different Developers
2 Minute Exposure in Nu Arc (Carbon Arc) Exposure Frame

| DEVELOPER | COMPOSITION OF PLATE COATING (Parts by Weight) | COATING WEIGHT (mg/sq. ft.) | SUBSTRATE | METHOD OF DEVELOPMENT | IMAGE AREAS | NON-IMAGE AREAS | PRESS RUN |
|---|---|---|---|---|---|---|---|
| 15% Lithium Benzoate 5% Hexylene Glycol | 2 Sensitizer 1 Glycidyl ether polyepoxide | 75 | Smooth, Chemically etched, Anodized | Automatic Machine Processor | Gray Scale-- Solid 7, Tail 10; halftone reproduction | No coating remaining on plate surface in un- | 5000 copies on over-packed press- |

TABLE II-continued

Comparison Data on Plate Development by Different Developers
2 Minute Exposure in Nu Arc (Carbon Arc) Exposure Frame

| DEVELOPER | COMPOSITION OF PLATE COATING (Parts by Weight) | COATING WEIGHT (mg/sq. ft.) | SUBSTRATE | METHOD OF DEVELOPMENT | IMAGE AREAS | NON-IMAGE AREAS | PRESS RUN |
|---|---|---|---|---|---|---|---|
| 80% Water | ½ Formvar 12/85 | | aluminum; Sodium Silicate interlayer | | similar to negative transparency | exposed areas | Acceptable reproduction |
| 15% Toluene Sulfonic Acid Sodium Salt 5% Hexylene Glycol 80% Water | " | " | " | " | Gray Scale-- Solid 2, Tail 4; halftone reproduction-sharpening of screen tints | No coating remaining on plate surface in unexposed areas | 5000 copies on over-packed press-slow ink pick-up, premature breakdown of screen tint image areas |
| 20% Lithium Dodecanoate 5% Duponol C-20 75% Water | 2 Sensitizer 1 Glycidyl ether polyepoxide 1 Formvar 12/85 | 100 | Brush-Grained, Chemically etched, Anodized aluminum; Sodium silicate interlayer | Hand Development | Gray Scale-- Solid 6, Tail 8; Image reproduction similar to negative transparency | No coating remaining on plate in unexposed areas | 5000 copies on over-packed press-Acceptable reproduction |
| 25% Normal propyl alcohol 5% Duponol C-20 70% Water | " | " | " | " | Gray Scale-- Solid 2, Tail 4; Sharpening of halftone screens in exposed image areas | Coating remaining on plate in unexposed areas | 5000 copies on over-packed press-Non-image areas showed scumming; premature breakdown of image areas |

What is claimed is:

1. A composition adapted for developing exposed diazo-sensitized photosensitive coatings on a substrate to remove therefrom non-image areas which comprises an aqueous solution of a water-miscible solvent and lithium benzoate wherein the concentration of said lithium salt is from 5% to 25% by weight of the total weight of the ingredients of said composition, said solution having a pH of from about 5 to about 12.

2. A developer composition according to claim 1 wherein said diazo-sensitized photosensitive coating on a substrate is a negative-acting lithographic plate, the light-sensitive coating of which is substantially water-insoluble and substantially solvent soluble.

3. A developer composition according to claim 1 wherein said diazo-sensitized photosensitive coating on a substrate is a positive-acting lithographic plate, and the aqueous solution has a pH of at least about 12.

4. A developer composition according to claim 1 wherein said diazo-sensitized photosensitive coating on a substrate is a negative-acting proofing system, the light-sensitive coating of which is substantially water-insoluble and substantially solvent soluble.

5. A developer composition according to claim 1 wherein said diazo-sensitized photosensitive coating on a substrate is a positive-acting proofing system, and the pH of the aqueous solution is at least about 12.

6. A developer composition according to claim 1 wherein said coating contains a reaction product of a diazo-aromatic polymer and a hydroxyl containing compound or a sulfonic acid containing compound.

7. A developer composition according to claim 6 wherein the diazo-aromatic polymer is that obtained from para-diazo-diphenylamine and reactive carbonyl-containing compounds.

8. A developer composition according to claim 1 wherein said composition contains up to about 10% by weight of a solvent for said photosensitive coating that is miscible in water, up to about 5% by weight of a nonionic, anionic or cationic surfactant, or up to about 5% of phosphoric acid or oxalic acid.

9. A composition adapted for developing exposed diazo-sensitized photosensitive coatings on a substrate to remove therefrom non-image areas which comprise an aqeous solution of from 5% to 25% by weight of the total weight of the ingredients in the composition, of lithium benzoate and up to about 10% by weight of the total weight of the ingredients in the composition, of a water-miscible solvent, said solution having a pH from about 5 to about 12.

* * * * *